(12) United States Patent
Yu et al.

(10) Patent No.: US 10,897,311 B2
(45) Date of Patent: Jan. 19, 2021

(54) OPTICAL SIGNAL MODULATION CIRCUIT AND APPARATUS

(71) Applicant: HUAWEI TECHNOLOGIES CO., LTD., Guangdong (CN)

(72) Inventors: Liqiang Yu, Shenzhen (CN); Liming Fang, Dongguan (CN); Sulin Yang, Dongguan (CN); Xiaofeng Zhang, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/452,389

(22) Filed: Jun. 25, 2019

(65) Prior Publication Data

US 2019/0319711 A1 Oct. 17, 2019

Related U.S. Application Data

(63) Continuation of application No. PCT/CN2016/112158, filed on Dec. 26, 2016.

(51) Int. Cl.
*H04B 10/04* (2006.01)
*H04B 10/50* (2013.01)
(Continued)

(52) U.S. Cl.
CPC ........... *H04B 10/505* (2013.01); *G02F 1/015* (2013.01); *H01S 5/0085* (2013.01); *H04B 10/564* (2013.01); *G02F 2001/0157* (2013.01)

(58) Field of Classification Search
CPC ........... H04B 10/505; H04B 10/50575; H04B 10/564; H04B 10/50593; H04B 10/588;
(Continued)

(56) References Cited

U.S. PATENT DOCUMENTS 5,973,812 A * 10/1999 Imai .................... H04B 10/2537
398/192
8,249,465 B2 * 8/2012 Nakamoto ........... H04B 10/564
398/198

(Continued)

FOREIGN PATENT DOCUMENTS

CN 101539591 A 9/2009
CN 201413927 Y 2/2010
(Continued)

*Primary Examiner* — Hibret A Woldekidan
(74) *Attorney, Agent, or Firm* — Womble Bond Dickinson (US) LLP (57) ABSTRACT

An optical signal modulation circuit includes a laser (DFB), a modulator (EAM), and an operational amplifier. The laser (DFB) generates a laser to stimulate the modulator (EAM) to generate a photon-generated current ($i_p$), a first port (a) of the modulator (EAM) is connected to a first input voltage ($V_{bias}$), a second port (b) of the modulator (EAM) is connected to an inverting input end of the operational amplifier, a non-inverting input end of the operational amplifier is connected to a second input voltage ($V_{in}$), and an output end of the operational amplifier is connected to the first port (a) of the modulator. In the modulation circuit, a photon-generated current ($i_p$) of the EAM is fed back to the operational amplifier, to implement a linear relationship between the second input voltage ($V_{in}$) and the photon-generated current ($i_p$) of the EAM, and obtain a linear EML transmission curve, namely, a high-linearity EML.

18 Claims, 4 Drawing Sheets

(51) Int. Cl.
*G02F 1/015* (2006.01)
*H01S 5/00* (2006.01)
*H04B 10/564* (2013.01)

(58) Field of Classification Search
CPC .............. H04B 10/801; G02F 1/015; G02F 2001/0157; G02F 1/0121; G02F 1/0123; G02F 2001/0155; H01S 5/0085; H01S 5/06
USPC ....... 398/183, 158, 160, 164, 192, 182, 195, 398/198
See application file for complete search history.

(56) References Cited

U.S. PATENT DOCUMENTS

| | | | | |
|---|---|---|---|---|
| 8,718,107 | B2* | 5/2014 | Lv | H04B 10/564 372/29.011 |
| 9,203,518 | B2* | 12/2015 | Ishii | H04B 10/505 |
| 9,584,222 | B2* | 2/2017 | Tatsumi | H04B 10/588 |
| 10,530,484 | B2* | 1/2020 | Hjartarson | G02F 1/0123 |
| 10,673,532 | B2* | 6/2020 | Hjartarson | H04B 10/50572 |
| 2003/0103255 | A1 | 6/2003 | Park | |
| 2004/0218931 | A1 | 11/2004 | Frederiksen et al. | |
| 2007/0057874 | A1* | 3/2007 | Le Roy | G09G 3/3233 345/76 |
| 2011/0242645 | A1* | 10/2011 | Sacks | G02F 1/39 359/330 |
| 2012/0269215 | A1 | 10/2012 | Lv | |
| 2015/0244466 | A1* | 8/2015 | Okamoto | H04B 10/54 398/140 |
| 2016/0226217 | A1 | 8/2016 | Jia et al. | |

FOREIGN PATENT DOCUMENTS

| | | | |
|---|---|---|---|
| CN | 101702489 A | | 5/2010 |
| CN | 201946873 U | | 8/2011 |
| CN | 102571003 A | * 7/2012 | ............... H01S 3/02 |
| CN | 102571003 A | | 7/2012 |
| CN | 103050887 A | | 4/2013 |
| CN | 103399418 A | | 11/2013 |
| CN | 103888190 A | | 6/2014 |
| EP | 2463624 A1 | | 6/2012 |
| JP | H09307506 A | | 11/1997 |
| JP | 2009-168833 A | | 7/2009 |
| WO | 03098327 A1 | | 11/2003 |

* cited by examiner

FIG. 1

1. Header (Header)
2. Photodiode (PD)
3. Submount (Submount)
4. Laser diode (LD)
5. Heat sink (Heat Sink)
6. Cap (Cap)
7. Window (Window)

OPTICAL SIGNAL MODULATION CIRCUIT AND APPARATUS

CROSS-REFERENCE TO RELATED APPLICATIONS

This application is a continuation of International Patent Application No. PCT/CN2016/112158, filed on Dec. 26, 2016, the disclosure of which is hereby incorporated by reference in its entirety.

TECHNICAL FIELD

This application relates to the field of communications technologies, and in particular, to an optical signal modulation circuit and an apparatus.

BACKGROUND

Figure 1:
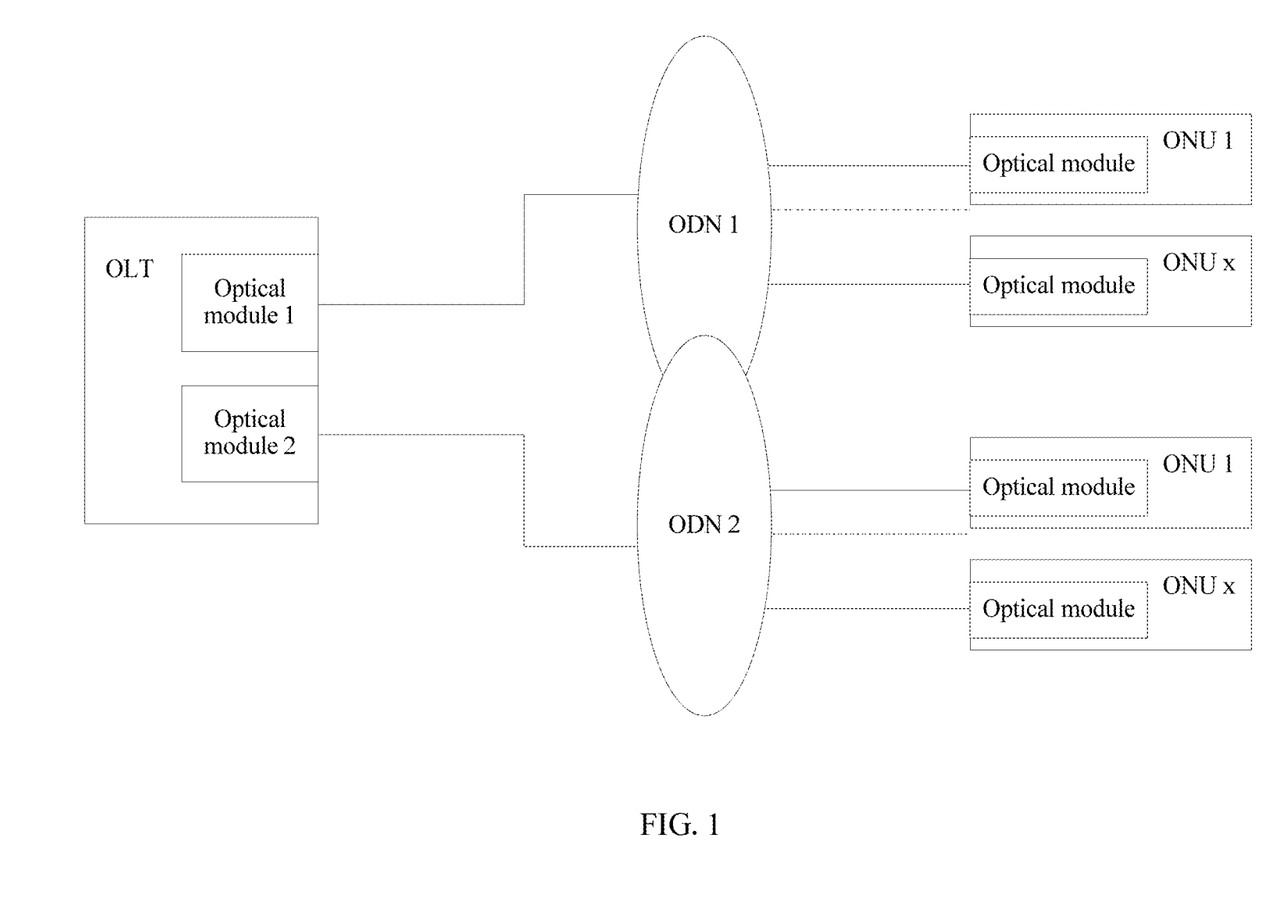
FIG. 1 is a schematic diagram of a system structure of a passive optical network.

Fiber-optic communications technology is one of popular technologies in the current communications industry and information industry, and is also a future development direction of communications technologies. As shown in FIG. 1, a passive optical network (PON) includes an optical line terminal (OLT) on an office side, an optical network unit (ONU) or an optical network terminal (ONT) on a user side, and an optical distribution network (ODN). Currently, representative PON technologies are a gigabit-capable passive optical network (GPON), an Ethernet passive optical network (EPON), a 10G-GPON (may also be referred to as an XG-PON), a 10G-EPON, and a time wavelength division multiplexing passive optical network (TWDM PON).

Figure 2:
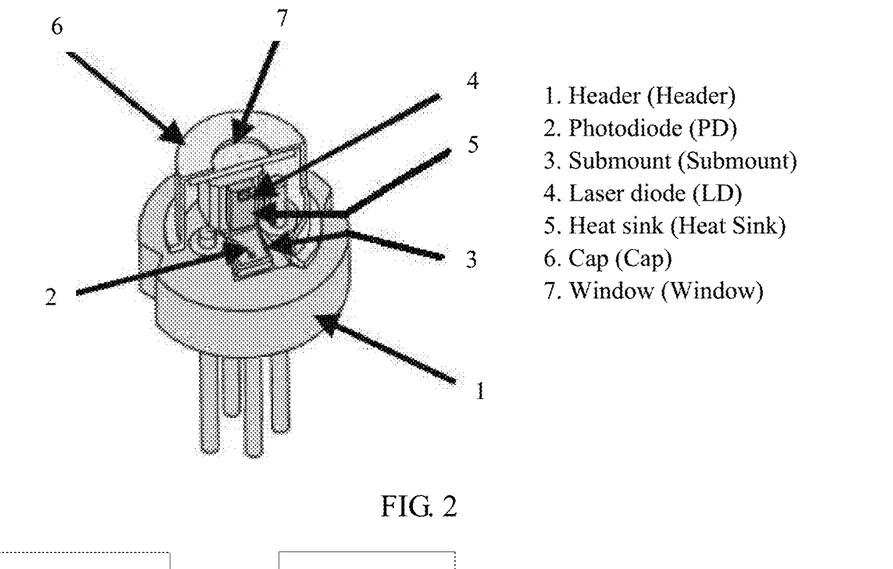
FIG. 2 is a schematic structural diagram of a TOSA, in a TO-CAN form, in an optical module in a passive optical network.

For the OLT and the ONU, an optical module is an indispensable component. The optical module includes a Bi-Directional Optical Sub-assembly (BOSA). The BOSA includes a transmitter optical subassembly (TOSA) and a receiver optical subassembly (ROSA). FIG. 2 shows a structure of a TOSA in a transistor-outline window-can (TO-CAN) form. The TOSA is formed by integrating a header 1 having pins with a cap 6 to which a window 7 is added. A laser diode (LD) 4 is placed on the header 1 in a specific form. The pins on the header 1 are separately connected to a signal electrode of the laser diode 4 by using gold wires. In this way, an external electrical signal can be transmitted to the laser diode 4 for electro-optical transfer. A photodiode (PD) 2 monitors an operating status of the laser diode 4 and is placed on a submount 3. The laser diode 4 is disposed on a heat sink 5 for heat dissipation. Modulation schemes of a light source in the BOSA may be classified into a direct modulation scheme and an external modulation scheme in which an external modulator is used. The direct modulation scheme has low costs, but has a limited transmission distance (approximately <20 km). Currently, a signal transmitted over a long distance is generated by using the external modulator. There are a plurality of types of external modulators such as an electro-absorption modulator and a Mach Zehnder Interferometer (MZI) modulator. For the electro-absorption modulator (EAM), there is a non-linear relationship between output optical power of the electro-absorption modulator and a bias voltage. Therefore, if the electro-absorption modulator is used to generate an analog signal, the generated analog signal has poor linearity, and an optical signal generated in a modulation process has great non-linear distortion. This causes an unsatisfactory long-distance transmission effect.

SUMMARY

Embodiments of this application provide an optical signal modulation circuit and an apparatus, to implement a linear relationship between output optical power of an EAM and an input voltage. This greatly alleviates non-linear distortion of an optical signal generated in a modulation process, and improves quality of long-distance fiber-optic transmission.

A first aspect of the embodiments of this application provides an optical signal modulation circuit. The circuit includes a laser, a modulator, and an operational amplifier, where the laser generates a laser to stimulate the modulator to generate a photon-generated current, a first port of the modulator is connected to a first input voltage, a second port of the modulator is connected to an inverting input end of the operational amplifier, a non-inverting input end of the operational amplifier is connected to a second input voltage, and an output end of the operational amplifier is connected to the first port of the modulator.

In one embodiment, the modulator is an electro-absorption modulator, a P-electrode of the electro-absorption modulator is connected to the first input voltage, an N-electrode of the electro-absorption modulator is connected to the inverting input end of the operational amplifier, and the output end of the operational amplifier is connected to the P-electrode of the electro-absorption modulator.

In one embodiment, the laser is a distributed feedback laser, a P-electrode of the distributed feedback laser is connected to a third input voltage, and an N-electrode of the distributed feedback laser is grounded.

In one embodiment, the optical signal modulation circuit further includes a first capacitor, where one end of the first capacitor is connected to the output end of the operational amplifier, and the other end of the first capacitor is connected to the P-electrode of the electro-absorption modulator.

In one embodiment, the optical signal generation circuit further includes a first resistor, where one end of the first resistor is connected to the N-electrode of the electro-absorption modulator, and the other end of the first resistor is grounded.

In one embodiment, the optical signal modulation circuit further includes a second capacitor, where one end of the second capacitor is connected to the inverting input end of the operational amplifier, and the other end of the second capacitor is connected to the N-electrode of the electro-absorption modulator.

In one embodiment, the optical signal modulation circuit further includes a second resistor, where one end of the second resistor is connected to the P-electrode of the electro-absorption modulator, and the other end of the second resistor is grounded.

In one embodiment, the operational amplifier includes a first transistor, a second transistor, a second resistor, a third resistor, a fourth resistor, and a fifth resistor and a sixth resistor, a base of the first transistor is connected to the second capacitor, a collector of the first transistor is connected to a first end of the third resistor, a base of the second transistor is connected to a first end of the fifth resistor and the second input voltage, a collector of the second transistor is connected to a first end of the fourth resistor, a first end of the second resistor is connected to the base of the first transistor, an emitter of the first transistor and an emitter of the second transistor are jointly connected to a negative electrode of an operating power supply, and a second end of the second resistor, a second end of the third resistor, a second end of the fourth resistor, and a second end of the fifth resistor are jointly connected to a positive electrode of the operating power supply.

A second aspect of the embodiments of this application further discloses an optical transmitter component, including the foregoing optical signal modulation circuit.

A third aspect of the embodiments of this application further discloses an optical line terminal, including the foregoing optical transmitter component.

A fourth aspect of the embodiments of this application further discloses an optical network unit, including the foregoing optical transmitter component.

In the embodiments of this application, a photon-generated current of the EAM is fed back to the operational amplifier, to implement a linear relationship between the second input voltage and the photon-generated current of the EAM, and a linear relationship between an output optical power of the EAM and the second input voltage is implemented based on a linear relationship between the photon-generated current of the EAM and the output optical power of the EAM. This alleviates non-linear distortion of an optical signal generated in a modulation process, and improves quality of long-distance fiber-optic transmission.

BRIEF DESCRIPTION OF DRAWINGS

To describe the technical solutions in the embodiments of this application more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following describes the embodiments of the present invention with reference to the accompanying drawings.

Figure 3:
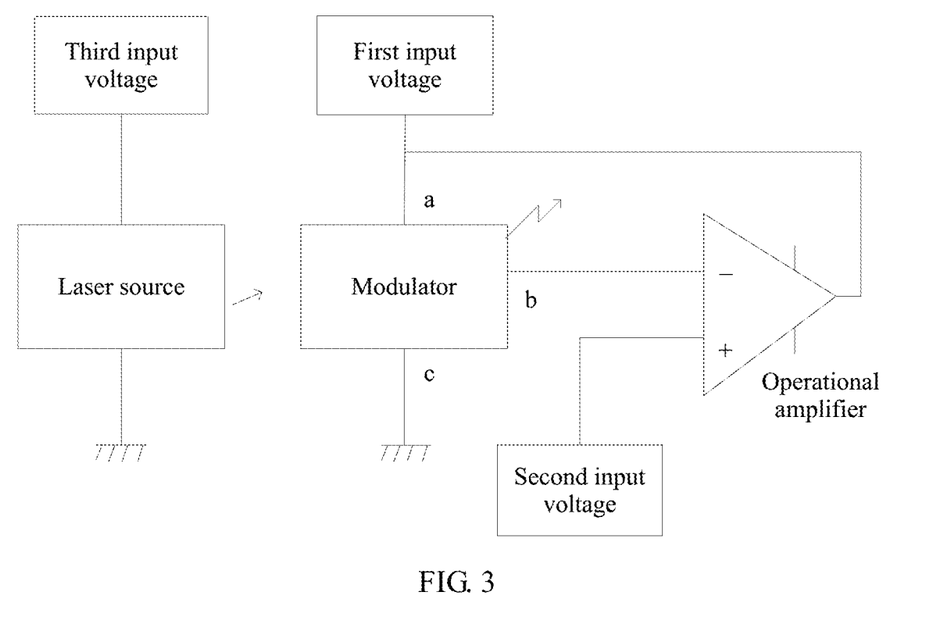
FIG. 3 is a schematic diagram of an optical signal modulation circuit according to an embodiment of this application.

As shown in FIG. 3, an embodiment of this application discloses an optical signal modulation circuit. The optical signal modulation circuit includes a laser, a modulator, and an operational amplifier. A first port a of the modulator is connected to a first input voltage (also referred to as a bias voltage), a second port b of the modulator is connected to an inverting input end of the operational amplifier, and a third port c of the modulator is grounded. A non-inverting input end of the operational amplifier is connected to a second input voltage, and an output end of the operational amplifier is connected to the first port a of the modulator. The laser is connected to a third input voltage. The laser generates continuous lasers, and a laser that is output by the laser is received by the modulator to generate a photon-generated current. The photon-generated current has a linear relationship with optical power absorbed by the modulator. It should be noted that the third input voltage may be a voltage provided by an internal power supply of the laser, or may be a voltage provided by an external power supply of the modulation circuit.

In the optical signal modulation circuit described in the foregoing embodiment, a linear relationship between output optical power and a drive voltage is implemented based on a linear relationship between the output power of the modulator and the photon-generated current. This alleviates non-linear distortion of an optical signal generated in a modulation process, and improves quality of long-distance fiber-optic transmission.

Figure 4:
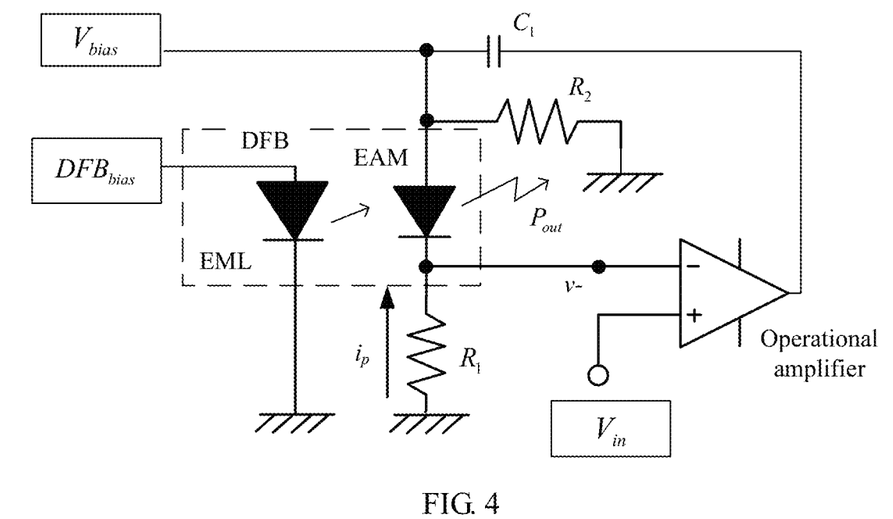
FIG. 4 is a schematic diagram of an optical signal modulation circuit according to an embodiment of this application.

FIG. 4 shows a specific implementation. An example in which the modulator is an electro-absorption modulator (Electro-absorption Modulator, EAM) is used for description. As shown in FIG. 4, a P-electrode of the electro-absorption modulator EAM is connected to the first input voltage $V_{bias}$, and an N-electrode of the electro-absorption modulator EAM is connected to the inverting input end of the operational amplifier. An example in which the laser is a distributed feedback laser (DFB) is used for description. The electro-absorption modulator EAM and the distributed feedback laser DFB form an electro-absorption modulated laser (EML). A P-electrode of the distributed feedback laser is connected to the third input voltage $DFB_{bias}$, and an N-electrode of the distributed feedback laser is grounded. The output end of the operational amplifier is connected to the P-electrode of the electro-absorption modulator. The electro-absorption modulator EAM is driven by a voltage to work. An input signal is a voltage, and an output signal is power. The EAM (or the EML) implements linearity provided that an output power signal and an input voltage signal meet a linear relationship.

In an optical signal modulation circuit shown in FIG. 4, because voltages at the two input ends of the operational amplifier are equal according to a "virtual short" principle of the operational amplifier, a voltage V− at the inverting input end is equal to the second input voltage $V_{in}$. Then, because a current at the inverting input end of the operational amplifier is zero according to the "virtual short" principle of the operational amplifier, a current passing through a second resistor $R_2$ is equal to a current passing through the EAM. Therefore, the photon-generated current $i_p$=V−/$R_2$, and in the entire circuit, $i_p$=$V_{in}$/$R_2$. It can be learned from FIG. 4 that a photon-generated current of the EAM is fed back to the operational amplifier, and for different values of the photon-generated current, an output of the operational amplifier compensates for voltages at two ends of the EAM, to implement a linear relationship between the second input voltage $V_{in}$ and the photon-generated current $i_p$ of the EAM. A linear relationship between an output optical power $P_{out}$ and the second input voltage $V_{in}$ is implemented, in other words, a linear relationship between output optical power of the EAM and an input voltage is implemented, based on a linear relationship between the photon-generated current $i_p$ of the EAM and the output optical power $P_{out}$ of the EAM. This alleviates non-linear distortion of an optical signal generated in a modulation process, and improves quality of long-distance fiber-optic transmission.

In one embodiment, the optical signal modulation circuit further includes a first capacitor $C_1$ and a first resistor $R_1$. One end of the first capacitor $C_1$ is connected to the output end of the operational amplifier, and the other end of the first capacitor $C_1$ is connected to the P-electrode of the electro-absorption modulator EAM. The first capacitor $C_1$ plays a function of blocking a direct current and allowing an alternating current. One end of the first resistor $R_1$ is connected to the N-electrode of the electro-absorption modulator EAM, and the other end of the first resistor $R_1$ is grounded.

In one embodiment, the optical signal modulation circuit further includes a second capacitor $C_2$ and the second resistor $R_2$. The second capacitor $C_2$ plays a function of blocking a direct current, and the second resistor $R_2$ plays a function of impedance matching. One end of the second capacitor $C_2$ is connected to the inverting input end of the operational amplifier, and the other end of the second capacitor $C_2$ is connected to the N-electrode of the electro-absorption modulator. One end of the second resistor $R_2$ is connected to the P-electrode of the electro-absorption modulator, and the other end of the second resistor $R_2$ is grounded.

The second input voltage $V_{in}$, the operational amplifier, the first capacitor $C_1$, the EAM, and the second resistor $R_2$ form a negative feedback circuit. The second capacitor $C_2$ is an optional component. A capacitance value is selected based on an actual circuit, or whether the second capacitor $C_2$ is required is determined based on an actual circuit. A capacitance value of the first capacitor $C_1$ is adjusted based on the actual circuit. The EML may be a monolithic integration structure of the DFB and the EAM, or may be a component in which the DFB and the EAM are independent of each other. If a monolithic integration component is selected as the EML, the N-electrode of the DFB needs to be separated from the N-electrode the EAM. In this embodiment, because the N-electrode of the EAM is connected in series to the first resistor $R_1$ and then is grounded, and the N-electrode of the DFB is directly grounded, the N-electrode of the EAM and the N-electrode the DFB need to be separately processed. Therefore, the N-electrode of the EAM needs to be separated from the N-electrode the DFB.

Figure 5:
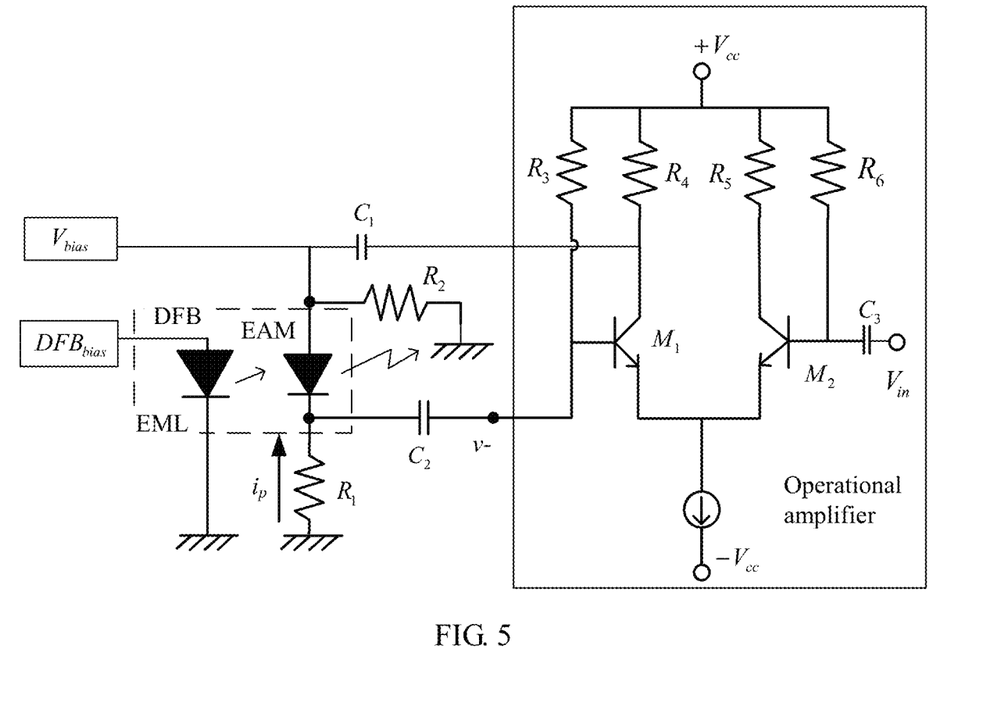
FIG. 5 is a schematic diagram of an optical signal modulation circuit according to an embodiment of this application.

As shown in FIG. 5, in a possible implementation, the operational amplifier includes a first transistor $M_1$, a second transistor $M_2$, a third resistor $R_3$, a fourth resistor $R_4$, a fifth resistor $R_5$, and a sixth resistor $R_6$. A base of the first transistor $M_1$ is connected to the second capacitor $C_2$, and a collector of the first transistor $M_1$ is connected to a first end of the fourth resistor $R_4$. A base of the second transistor $M_2$ is connected to a first end of the sixth resistor $R_6$ and the second input voltage $V_{in}$, and a collector of the second transistor $M_2$ is connected to a first end of the fifth resistor $R_5$. A first end of the third resistor $R_3$ is connected to the base of the first transistor $M_1$, an emitter of the first transistor $M_1$ and an emitter of the second transistor $M_2$ are jointly connected to a negative electrode $-V_{cc}$ of an operating power supply. A second end of the third resistor $R_3$, a second end of the fourth resistor $R_4$, a second end of the fifth resistor $R_5$ and a second end of the sixth resistor $R_6$ are jointly connected to a positive electrode $+V_{cc}$ of the operating power supply. A resistance value of the third resistor $R_3$ a resistance value of the fourth resistor $R_4$, a resistance value of the fifth resistor $R_5$ and a resistance value of the sixth resistor $R_6$ are adjusted based on an actual situation.

In one embodiment, a third capacitor $C_3$ is further connected between the base of the second transistor $M_2$ and the second input voltage $V_{in}$. The third capacitor $C_3$ plays a function of blocking a direct current and allowing an alternating current, and a capacitance value of the third capacitor $C_3$ is adjusted based on an actual situation.

Figure 6:
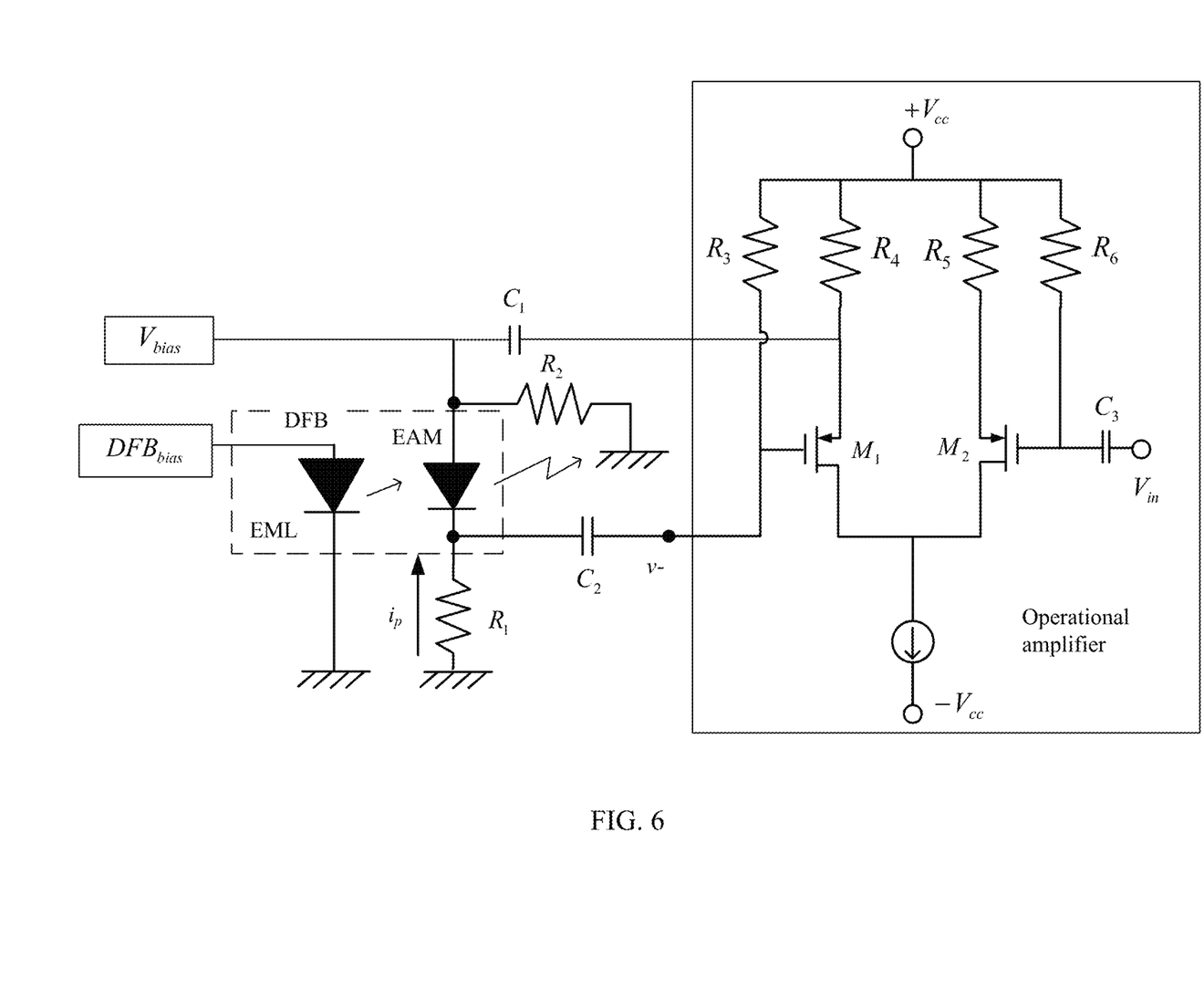
FIG. 6 is a schematic diagram of an optical signal modulation circuit according to an embodiment of this application.

FIG. 5 shows an example in which the first transistor $M_1$ and the second transistor $M_2$ are bipolar junction transistors (BJT). The first transistor $M_1$ and the second transistor $M_2$ may alternatively be field effect transistors (FET), as shown in FIG. 6.

The optical signal modulation circuit that includes the EAM and that is disclosed in the foregoing embodiment may be placed in a TOSA of an optical line terminal or a TOSA of an optical network unit. For example, the laser diode in FIG. 2 may be replaced with the optical signal modulation circuit that includes the EAM and that is provided in the embodiments of this application.

The present invention further discloses an optical transmitter component, for example, a TOSA or a ROSA. The TOSA or the ROSA includes the optical signal modulation circuit described in the foregoing embodiment. The high-linearity optical transmitter component disclosed in this embodiment may be used in an optical line terminal or an optical network unit, to greatly alleviate non-linear distortion of an optical signal generated in a modulation process, and improve quality of long-distance fiber-optic transmission.

Although several embodiments have been provided in the embodiments of this application, it can be understood that the disclosed circuit and apparatus may be implemented in many other specific forms without departing from the spirit or scope of the present disclosure. For example, the foregoing optical signal modulation circuit may be in an integrated circuit (IC) encapsulation form. The examples disclosed in the embodiments should be considered as an illustration rather than a limitation, and a purpose of the examples is not limited to the details provided in this specification. For example, elements or components may be combined or integrated into another system, or some features may be ignored or not implemented.

In addition, without departing from the scope of the present disclosure, the technology, system, subsystem, and method described and illustrated in the embodiments to be discrete or separate may be combined or integrated with another system, module, technology, or method. The displayed or discussed mutual couplings or direct couplings or communication connections may be implemented by using some interfaces. The indirect couplings or communication connections between devices or intermediate components may be implemented in electronic, mechanical, or other forms. Without departing from the spirit and scope disclosed in this specification, a person skilled in the art may determine examples of other changes, replacements, and modifications.

What is claimed is:

1. An optical signal modulation circuit, comprising a laser source, a modulator, and an operational amplifier, wherein the laser source generates a laser to stimulate the modulator to generate a photon-generated current, a first port of the modulator is connected to a first input voltage, a second port of the modulator is connected to an inverting input end of the operational amplifier, a non-inverting input end of the operational amplifier is connected to a second input voltage, and an output end of the operational amplifier is connected to the first port of the modulator, wherein the modulator is an electro-absorption modulator, a P-electrode of the electro-absorption modulator is connected to the first input voltage, an N-electrode of the electro-absorption modulator is connected to the inverting input end of the operational amplifier, and the output end of the operational amplifier is connected to the P-electrode of the electro-absorption modulator.

2. The optical signal modulation circuit according to claim 1, wherein the laser source includes a distributed feedback laser source, a P-electrode of the distributed feedback laser source is connected to a third input voltage, and an N-electrode of the distributed feedback laser source is grounded.

3. The optical signal modulation circuit according to claim 1, further comprising a first capacitor, wherein one end of the first capacitor is connected to the output end of the operational amplifier, and the other end of the first capacitor is connected to the P-electrode of the electro-absorption modulator.

4. The optical signal modulation circuit according to claim 1, further comprising a first resistor, wherein one end of the first resistor is connected to the N-electrode of the electro-absorption modulator, and the other end of the first resistor is grounded.

5. The optical signal modulation circuit according to claim 1, further comprising a second capacitor, wherein one end of the second capacitor is connected to the inverting input end of the operational amplifier, and the other end of the second capacitor is connected to the N-electrode of the electro-absorption modulator.

6. The optical signal modulation circuit according to claim 5, further comprising a second resistor, wherein one end of the second resistor is connected to the P-electrode of the electro-absorption modulator, and the other end of the second resistor is grounded.

7. The optical signal modulation circuit according to claim 5, wherein the operational amplifier comprises a first transistor, a second transistor, a third resistor, a fourth resistor, a fifth resistor, and a sixth resistor, a base of the first transistor is connected to the second capacitor, a collector of the first transistor is connected to a first end of the fourth resistor, a base of the second transistor is connected to a first end of the sixth resistor and the second input voltage, a collector of the second transistor is connected to a first end of the fifth resistor, a first end of the third resistor is connected to the base of the first transistor, an emitter of the first transistor and an emitter of the second transistor are jointly connected to a negative electrode of an operating power supply, and a second end of the third resistor, a second end of the fourth resistor, a second end of the fifth resistor, and a second end of the sixth resistor are jointly connected to a positive electrode of the operating power supply.

8. An optical transmitter component, comprising an optical signal modulation circuit, wherein the optical signal modulation circuit comprises a laser source, a modulator, and an operational amplifier, wherein the laser source generates a laser to stimulate the modulator to generate a photon-generated current, a first port of the modulator is connected to a first input voltage, a second port of the modulator is connected to an inverting input end of the operational amplifier, a non-inverting input end of the operational amplifier is connected to a second input voltage, and an output end of the operational amplifier is connected to the first port of the modulator, wherein the modulator is an electro-absorption modulator, a P-electrode of the electro-absorption modulator is connected to the first input voltage, an N-electrode of the electro-absorption modulator is connected to the inverting input end of the operational amplifier, and the output end of the operational amplifier is connected to the P-electrode of the electro-absorption modulator.

9. The optical transmitter component according to claim 8, wherein the laser source includes a distributed feedback laser source, a P-electrode of the distributed feedback laser source is connected to a third input voltage, and an N-electrode of the distributed feedback laser source is grounded.

10. The optical transmitter component according to claim 8, further comprising a first capacitor, wherein one end of the first capacitor is connected to the output end of the operational amplifier, and the other end of the first capacitor is connected to the P-electrode of the electro-absorption modulator.

11. The optical transmitter component according to claim 8, further comprising a first resistor, wherein one end of the first resistor is connected to the N-electrode of the electro-absorption modulator, and the other end of the first resistor is grounded.

12. The optical transmitter component according to claim 8, further comprising a second capacitor, wherein one end of the second capacitor is connected to the inverting input end of the operational amplifier, and the other end of the second capacitor is connected to the N-electrode of the electro-absorption modulator.

13. The optical transmitter component according to claim 12, further comprising a second resistor, wherein one end of the second resistor is connected to the P-electrode of the electro-absorption modulator, and the other end of the second resistor is grounded.

14. The optical transmitter component according to claim 12, wherein the operational amplifier comprises a first transistor, a second transistor, a third resistor, a fourth resistor, a fifth resistor, and a sixth resistor, a base of the first transistor is connected to the second capacitor, a collector of the first transistor is connected to a first end of the fourth resistor, a base of the second transistor is connected to a first end of the sixth resistor and the second input voltage, a collector of the second transistor is connected to a first end of the fifth resistor, a first end of the third resistor is connected to the base of the first transistor, an emitter of the first transistor and an emitter of the second transistor are jointly connected to a negative electrode of an operating power supply, and a second end of the third resistor, a second end of the fourth resistor, a second end of the fifth resistor, and a second end of the sixth resistor are jointly connected to a positive electrode of the operating power supply.

15. An optical line terminal, comprising an optical transmitter component, wherein the optical transmitter component comprises an optical signal modulation circuit, wherein the optical signal modulation circuit comprises a laser source, a modulator, and an operational amplifier, wherein the laser source generates a laser to stimulate the modulator to generate a photon-generated current, a first port of the modulator is connected to a first input voltage, a second port of the modulator is connected to an inverting input end of the operational amplifier, a non-inverting input end of the operational amplifier is connected to a second input voltage, and an output end of the operational amplifier is connected to the first port of the modulator, wherein the modulator is an electro-absorption modulator, a P-electrode of the electro-absorption modulator is connected to the first input voltage, an N-electrode of the electro-absorption modulator is connected to the inverting input end of the operational amplifier, and the output end of the operational amplifier is connected to the P-electrode of the electro-absorption modulator.

16. The optical line terminal according to claim 15, wherein the modulator is an electro-absorption modulator, a P-electrode of the electro-absorption modulator is connected to the first input voltage, an N-electrode of the electro-absorption modulator is connected to the inverting input end of the operational amplifier, and the output end of the operational amplifier is connected to the P-electrode of the electro-absorption modulator.

17. The optical line terminal according to claim 16, wherein the laser source includes a distributed feedback laser source, a P-electrode of the distributed feedback laser source is connected to a third input voltage, and an N-electrode of the distributed feedback laser source is grounded.

18. The optical line terminal according to claim 16, further comprising a first capacitor, wherein one end of the first capacitor is connected to the output end of the operational amplifier, and the other end of the first capacitor is connected to the P-electrode of the electro-absorption modulator.

* * * * *